United States Patent [19]

Majidi-Ahy et al.

[11] Patent Number: 4,983,910
[45] Date of Patent: Jan. 8, 1991

[54] MILLIMETER-WAVE ACTIVE PROBE

[75] Inventors: Gholamreza Majidi-Ahy, Sunnyvale; David M. Bloom, Portola Valley, both of Calif.

[73] Assignee: Stanford University, Stanford, Calif.

[21] Appl. No.: 196,998

[22] Filed: May 20, 1988

[51] Int. Cl.$^5$ .................. G01R 1/06; G01R 1/067
[52] U.S. Cl. .................. 324/158 P; 324/72.5; 324/158 F; 333/32; 333/33
[58] Field of Search .................. 307/271; 328/16; 329/158 P, 158 F, 158 R, 72.5; 331/76, 77; 333/218, 33, 34, 32; 324/129

[56] References Cited

U.S. PATENT DOCUMENTS

| 2,904,685 | 9/1959 | Salmet | 331/76 |
| 3,194,973 | 7/1965 | Ludwig et al. | 328/16 |
| 3,343,069 | 9/1967 | Tsuda | 333/218 |
| 3,402,340 | 9/1968 | Ringereide | 333/218 |
| 3,868,588 | 2/1975 | Schwartzmann et al. | 331/77 |
| 4,348,646 | 9/1982 | Newton et al. | 331/77 |
| 4,514,022 | 4/1985 | Payne | 324/158 P |
| 4,523,163 | 6/1985 | Houdart et al. | 333/218 |
| 4,531,105 | 7/1985 | Kumar | 333/218 |
| 4,593,243 | 6/1986 | Lao et al. | 324/158 P |
| 4,749,949 | 6/1988 | Albin et al. | 307/271 |
| 4,791,363 | 12/1988 | Logan | 324/158 F |

OTHER PUBLICATIONS

"Piosecond Optical Sampling of GaAs Integrated Circuits" by Weingarten et al, IEEE Journ. of Quant. Electron, vol. 24, #2, 2/88 pp. 198–220.

Primary Examiner—Reinhard J. Eisenzopf
Assistant Examiner—W. Burns
Attorney, Agent, or Firm—Ronald C. Fish

[57] ABSTRACT

A millimeter-wave active probe for use in injecting signals with frequencies above 50GHz to millimeter-wave and ultrafast devices and integrated circuits including a substrate upon which a frequency multiplier consisting of filter sections and impedance matching sections are fabricated in uniplanar transmission line format. A coaxial input and uniplanar 50 ohm transmission line couple an approximately 20 GHz input signal to a low pass filter which rolls off at approximately 25 GHz. An input impedance matching section couples the energy from the low pass filter to a pair of matched, antiparallel beam lead diodes. These diodes generate odd-numberd harmonics which are coupled out of the diodes by an output impedance matching network and bandpass filter which suppresses the fundamental and third harmonics and selects the fifth harmonic for presentation at an output.

12 Claims, 4 Drawing Sheets

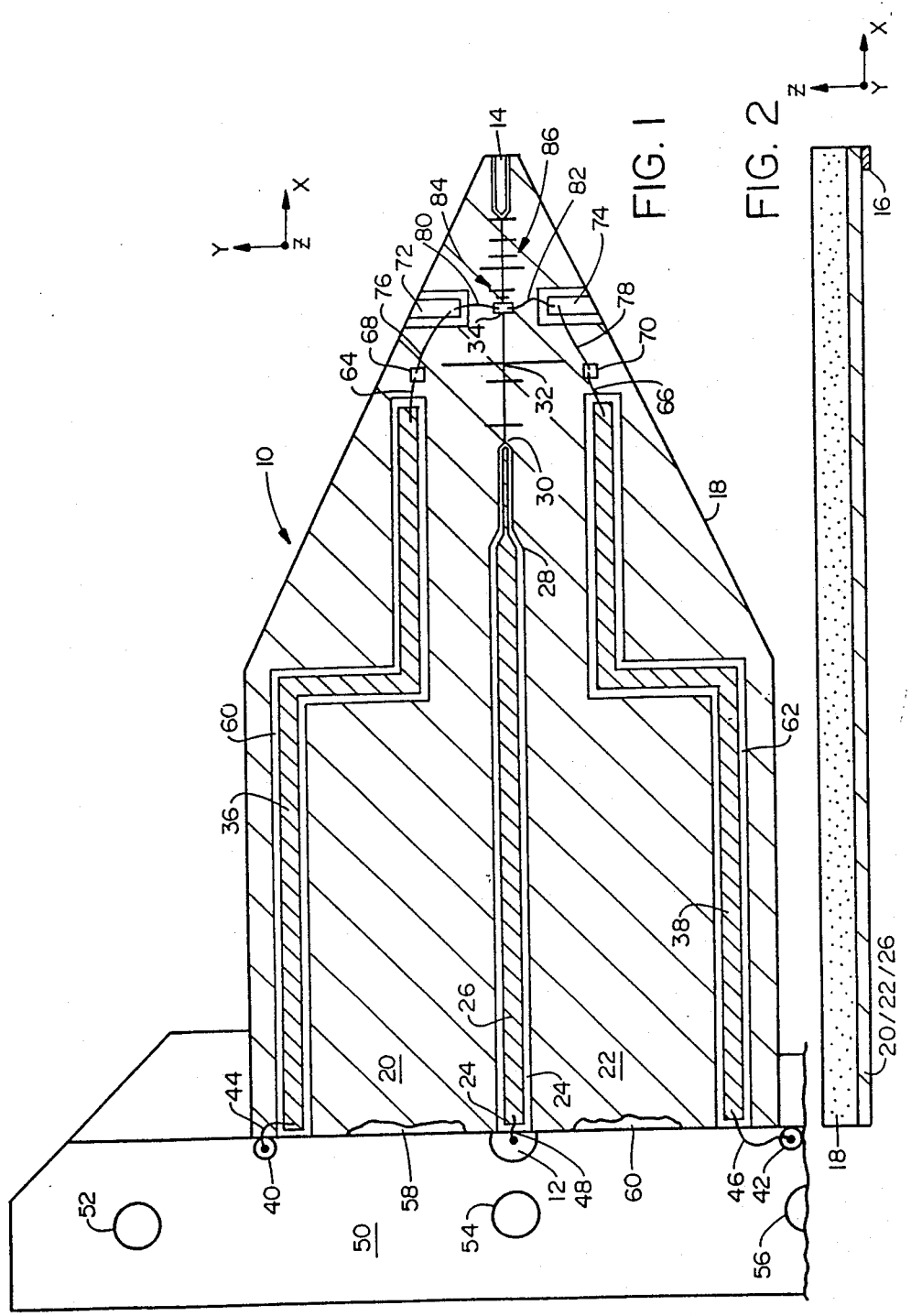

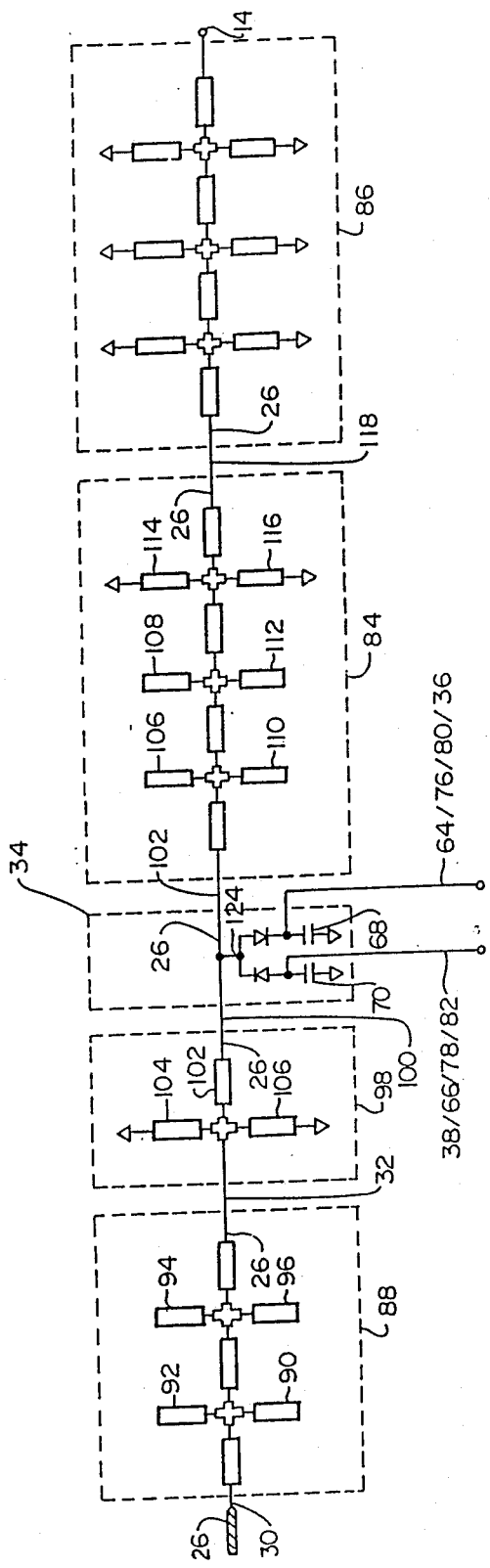
FIG. 3
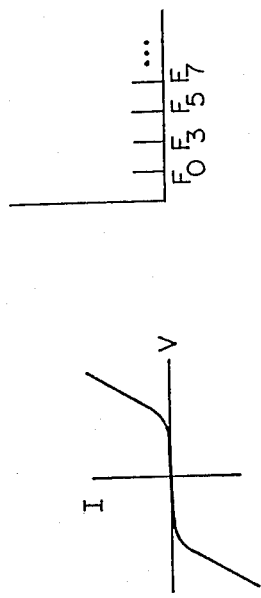
FIG. 4
FIG. 5

MILLIMETER-WAVE ACTIVE PROBE

BACKGROUND OF THE INVENTION

The U.S. Government has a paid-up license in this invention and the right in limited circumstances to require the patent owner to license others on reasonable terms as provided for by the terms of contract No. F33615-86-C-1126, awarded by Air Force Wright Avionics Laboratory. The invention pertains to the field of testing and characterization of millimeter-wave and very high speed devices and integrated circuits such as those fabricated on gallium arsenide. More particularly, the invention pertains to the field of generating millimeterwave frequencies for test purposes and guiding these test signals to a particular point on a device or an integrated circuit to be characterized.

Conventional millimeter-wave sources have their outputs in waveguide configuration. This creates a great deal of complexity and inconvenience in trying to inject signals from a waveguide at particular points of the microscopic structure of a millimeter-wave or an ultra-fast device or integrated circuit. With waveguide output of conventional millimeter-wave test signal sources, it is necessary to plumb the waveguide to the location of the integrated circuit and use suitable adaptors and test fixtures to couple the energy out of the waveguide and onto the integrated circuit. This must be done with a minimum of losses caused by scattering of energy into higher order modes and with a minimum of reflection back toward the input of energy propagating in the desired mode at discontinuities. Because of the awkwardness and inconvenience of using waveguide output signal sources, high frequency coaxial cable and connectors and wafer probes having a planar configuration using coplanar waveguides have been developed for up to 50 GHz. A tapered wafer probe with a planar configuration can more easily be used to contact pads on the device or integrated circuit.

Cascade Microtech Inc. currently makes a passive coplanar waveguide probe for use up to 50 GHz to contact devices or integrated circuit pads. This probe has a coaxial cable input to receive a test signal at a frequency below 50 GHz to be injected and couples energy from this test signal into a coplanar waveguide printed on the surface of the insulating substrate of the probe. This substrate tapers to a point where contact pads coupled to the coplanar waveguide are formed. Gold balls are bonded to these contact pads. These gold balls are placed in contact with the contact pads on the integrated circuit to be tested to inject the test signal.

One difficulty with using such a probe is that high frequency test sources capable of generating test signals at approximately 100 GHz with coaxial outputs are not available. Another difficulty is that at least the coaxial section of the probe is not usable at frequencies above 50 GHz. These are because coaxial cable and connectors are not currently available for operation at frequencies above 50 GHz. Coaxial cable cannot be used at these high frequencies because the dimensions of the cable would have to be so small as to preclude a practical structure. This restriction on dimensions is a result of the solutions to Maxwell's equations. It is desirable to propagate energy in only one mode, the lowest order or the fundamental mode. The cutoff frequency for the higher order modes for coaxial cable is set by the circumference of the outer conductor. When this dimension approaches the wavelength of the signal to be guided through the coaxial cable, scattering of energy into higher order modes occurs which is undesirable. Thus, to guide higher frequencies with coaxial cable requires the dimensions of the cable to be made increasingly smaller. However, this shrinking of the cable must be made proportionally to all dimensions to maintain an industry standard characteristic impedance of 50 ohms. Because of mechanical and electrical constraints which have yet to be overcome, at the current time, no coaxial cable exists which can be used above 50 GHz.

Signal sources which can provide output test signals at frequencies above 50 GHz are available, but the output configuration of these systems is waveguide instead of coaxial. One difficulty with using a planar probe in connection with a waveguide configuration output from a high frequency millimeter-wave source is that an adapter must be made for use between the waveguide configuration and the coaxial configuration at the input of the probe. Another difficulty is that the coaxial part of the probe cannot be used above 50 GHz with today's technology. Because the shapes of the rectangular waveguide at the output of the test source and the coaxial cable at the input of the probe are mismatched, making a suitable adapter is difficult and causes losses from the resulting discontinuity as will be understood by those skilled in the art. Coaxial systems can currently be used to guide millimeterwave energy at or below approximately 50 GHz to planar configuration IC passive probes such as the Cascade Microtech Inc. probe. However, to extend the frequency of sources beyond approximately 50 GHz requires the use of frequency multipliers to raise the frequency and requires the above-described waveguide-to-coax fixtures to couple energy from the waveguide output of the multiplier into the chip under test.

Needle probes which were in use before the introduction of the planar configuration probe by Cascade Microtech Inc. are unacceptable at the very high frequencies prevalent in the microwave and millimeter-wavelength bands. The reason for this is that the inductance of the needle probe wire presents a very high impedance to the test signal microwave and millimeter-wavelength frequencies. This causes difficulty in coupling sufficient amounts of energy to the chip under test because of the impedance mismatch between the 50 ohm line coaxial cable and the impedance of the wire probe. This impedance mismatch causes reflection of power at the interface thereby limiting the amount of power which is available for coupling to the chip under test.

Recently, Cascade Microtech Inc. probes with 2.4 millimeter coaxial connectors have been made publicly available. These probes allow single probe coaxial test operations to be made up to 50 GHz. However, such probes still cannot be used at frequencies above 50 GHz, the frequency range which many new fast technologies are operating.

An alternative approach would be to generate millimeter-wave signals closer to the input of the integrated circuit on the wafer under test. For example, the signal could be generated directly on the wafer by mixing two optical beams which are separated in frequency by the desired millimeter-wave test frequency in a nonlinear device on the wafer. The disadvantage of this approach is the need for two complex optical systems and the need for an appropriate nonlinear device formed on the wafer under test. This makes the approach unattractive for many users.

Therefore, a need has arisen for a system which can generate millimeter-wave frequencies above 50 GHz easily with low loss and with single mode operation for use in testing and characterization of millimeter-wave and ultra-fast devices and integrated circuits. Such a system must have a configuration to allow easy coupling of the energy to the integrated circuit and must not require any special constructions or device formation on the wafer under test. Further, the system must have a simple interface with conventional millimeter-wave sources and must be efficient in coupling large amounts of the power generated by these millimeter-wave sources to the chip under test.

SUMMARY OF THE INVENTION

According to the teachings of the invention, there is taught a modification to the structure of prior art, planar-configuration, millimeter-wave wafer probes by placement or integration on the probe substrate of a circuit including at least one nonlinear element for frequency multiplication. This nonlinear element is coupled with suitable filter sections and impedance matching sections which are integrated on the substrate of the wafer probe in coplanar waveguide format to comprise a frequency multiplier active probe. The combination is capable of receiving test signals of a lower frequency and multiplying them to the frequency range above 50 GHz and is capable of filtering out undesired frequency components, all energy transfer being in the single fundamental mode and without substantial losses of power from reflection or scattering into higher order modes. The combination is also quite convenient to use because of the coaxial cable input.

The construction of the probe, in the preferred embodiment, is coplanar waveguide throughout with a beam lead GaAs diode pair as the nonlinear element. The substrate of the wafer probe, in the preferred embodiment, is insulating alumina, although other insulating substrates may also be used providing they have a similar isotropic dielectric constant and thickness. A planar surface of the substrate is metallized with a titanium-tungsten-gold conductive layer which is approximately 1 micron thick. This metalization pattern is photolithographically etched to form two ground planes separated by an insulating gap through which an RF signal conductor is routed.

The substrate is tapered and has a wide end and a narrow end. At the wide end, a coaxial connector is mounted. The outer conductor of the coaxial connector is bonded by conductive epoxy to the two ground planes. The center conductor of the coaxial connector is wire or ribbon bonded to the center RF signal conductor. The dimensions of the center signal conductor, the gaps separating it from the two ground planes, and the thickness of the metalization as well as the thickness and dielectric constant are selected so as to provide a 50 ohm characteristic impedance for the input and output of the circuit on the substrate.

The frequency multiplier is comprised of several sections. The first section is a low-pass filter consisting of coplanar waveguide segments connected to two pairs of coplanar waveguide stubs terminated in open circuits. The dimensions of the open circuit coplanar waveguide stubs and the line segments are such that the filter has a characteristic impedance of 50 ohms at the input frequency of approximately 20 GHz in the preferred embodiment. The dimensions of the low-pass filter elements are also selected so as to establish distributed inductive and capacitive reactances which establish a cut-off frequency which is slightly greater than the highest frequency in the input frequency band, i.e., approximately 25 GHz.

The output of the low-pass filter is coupled to the input of an input impedance matching network. This network is, in one embodiment, comprised of a segment of coplanar waveguide connected to two coplanar waveguide stubs which are terminated in short circuits to the ground plane. The dimensions of this input matching network are such that the input impedance for signals at the input frequency of approximately 20 GHz is 50 ohms looking into the input in the preferred embodiment. The dimensions are also established such that the impedance looking into the output of this input impedance matching network is substantially the complex conjugate of the input impedance of the diodes at the input signal frequency. The dimensions are also established so that the impedance at the output of the input impedance matching network is substantially zero for the third harmonic of the input signal frequency and very high for the fifth harmonic of the input signal frequency. This characteristic reflects the desired fifth harmonic toward the output while suppressing generation of the third harmonic by the nonlinear element.

The output of the input impedance matching network is coupled to an anti parallel pair of beam-lead GaAs diodes. These diodes are coupled through capacitors to the ground plane. In one embodiment, the diodes are also coupled individually to D.C. bias lines. These bias line conductors are photolithographically formed in gaps in the ground plane and are routed between D.C. bias input connectors and a position near the diodes. The diodes are connected to the D.C. bias conductors by gold wires which are wire bonded between the capacitors, a contact pad and the diodes. The D.C. bias conductors allow individual D.C. bias voltages to be applied to each diode. In the case where the beam-lead diodes are perfectly matched, this D.C. bias circuitry can be eliminated. However, if the diodes are not perfectly matched, the D.C. bias circuitry is desirable to allow the diodes to be electrically matched so as to cancel out even harmonics at the output of the probe for an odd order frequency multiplier.

The purpose of using matched, anti-parallel diodes for an odd order frequency multiplier is to create a nonlinear element which will generate only odd-numbered harmonics of the input signal. Thus, for an input signal at 20 GHz, there will be a third harmonic at 60 GHz and a fifth harmonic at 100 GHz. There will also be higher order harmonics, but the designs of the filter and impedance matching sections are such that transmission of energy to the output at these higher harmonics and at the third harmonic is suppressed. In alternative embodiments, other multiplier structures can be used as triplers or to multiply the frequency of the input signal by a factor of 7. In some alternative embodiments, the frequency multiplier may be a quadrupler. In a quadrupler embodiment, the even order harmonics are generated and the odd order harmonics are suppressed.

The anti-parallel diode pair is coupled to the input of an output impedance matching network This network is comprised of a plurality of coplanar waveguide line segments interconnecting two pairs of coplanar waveguide stubs terminated in open circuits and one pair of coplanar waveguide stubs terminated in short circuits to the ground plane. The dimensions of the stubs, interconnecting segments and metalization thickness, as well as the insulating gap widths, substrate thickness and dielectric constant are selected to establish certain impedance characteristics. In particular, these dimensions are established such that the input impedance at the fifth harmonic frequency is the complex conjugate of the output impedance of the diodes at the fifth harmonic frequency for maximum power transfer. The dimensions are also selected so that the input impedance is very large at the frequency of the input signal so as to reflect energy at this frequency back to the diodes. Further, the characteristic impedance looking into the input of the output matching network at the frequency of the third harmonic and higher order harmonic such as seventh, ninth, etc., is substantially low, preferably near zero so as to suppress these harmonics.

The output of the output-matching network is coupled to the input of a bandpass filter section. This filter is comprised of a plurality of coplanar waveguide segments interconnecting the input of the bandpass filter to the output of the probe structure and to a plurality of coplanar waveguide stubs. In one embodiment, at least three pairs of coplanar waveguide stubs having short circuit terminations to the ground plane are used which together with line segments establish the proper distributed inductive and capacitive reactances to obtain the desired filter characteristics and characteristic impedance. The bandpass filter has a characteristic impedance looking into both the input and output of 50 ohms at the fifth harmonic frequency in the preferred embodiment. The output impedance of the filter is 50 ohms at fifth harmonic frequency in the preferred embodiment, and the structure is terminated in any structure suitable for use in probing millimeter-wave or ultra-fast devices or integrated circuit structures. In the preferred embodiment, a plated metal is used but the gold balls or any terminal structure such as those used by Cascade Microtech Inc. coplanar probes will suffice.

BRIEF DESCRIPTION OF THE DRAWINGS

FIG. 1 is a plan view of the structure of the millimeter-wave active probe according to one embodiment of the invention. FIG. 2 is a side elevation view of the probe of FIG. 1 looking down the y axis.

FIG. 3 is an electrical schematic diagram of the filter and matching sections in the frequency multiplier showing the number and relationship of coplanar waveguide segments making up the various filter and impedance matching sections and the types of terminations used on the stub lines.

FIG. 4 is an I-V characteristic curve of the anti-parallel diodes used in the frequency multiplier.

FIG. 5 is a symbolic frequency spectrum plot of the harmonics generated by the frequency multiplier.

DETAILED DESCRIPTION OF THE PREFERRED EMBODIMENT

Figure 6:
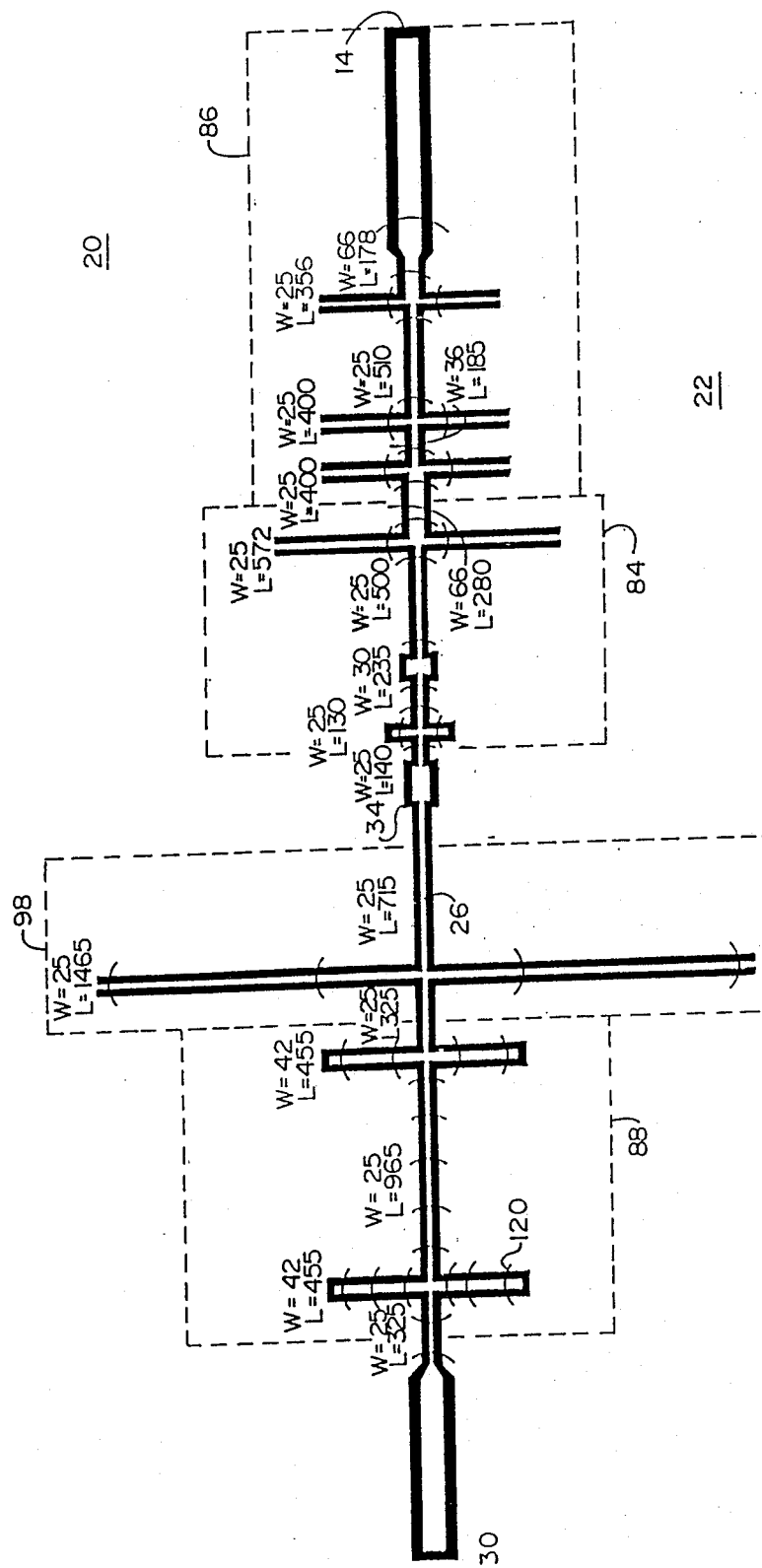
FIG. 6 is a scaled drawing of one embodiment of the filter and impedance matching sections showing the relative dimensions of all the structures.

Referring to FIG. 1, there is shown a plan view of an active millimeter-wave probe 10. FIG. 2 shows the probe 10 in elevation, i.e., looking down the Y-axis. The purpose of the active probe is to receive an input signal at a frequency on the order of 20 GHz at a coaxial connector 12 and to multiply this signal in frequency by a factor of five for output for the active probe quintupler. Filtering must also be done to remove undesired harmonics from the signal at an output node 14. The 100 GHz test signal at the output node is applied to a contact pad or transmission line structure of a device or an integrated circuit under test (not shown) for purposes of testing and characterizing the device or the circuit. The output node is shown in FIG. 2 at 16. The node 16 represents a metalization pattern which is formed on the RF signal conductor 14 for purposes of making contact with a device or an integrated circuit.

Typically, the input impedance at approximately 20 GHz looking into the coaxial connector of 12 of the active probe is 50 ohms, and the characteristic impedance at approximately 100 GHz looking into the output node 14 of the active probe is also 50 ohms. The reason for choosing these impedances is that characteristic impedance of coaxial cable, connectors and input-/output impedances of typical integrated circuits are generally 50 ohms. Thus, the characteristic input impedance of the active probe at the frequency of the input signal should also be 50 ohms for maximum power transfer from the coaxial cable to the structures on the active probe 10. Also test signals are normally injected into a 50 ohm coplanar waveguide formed on the surface of the device or integrated circuit under test. Therefore, the characteristic impedance looking into the output node 14 of the active probe should also be 50 ohms at the frequency of the output signal, approximately 100 GHz, for best power transfer from the active probe to the device or integrated circuit under test.

To use the active probe 10 shown in FIGS. 1 and 2, a signal source capable of generating a test signal of approximately 20 GHz is coupled to the coaxial connector 12 by 50 ohm coaxial cable. This 20 GHz input signal is coupled to the unit coplanar waveguide line and the frequency multiplier section on the surface of the active probe 10 and is converted to a 100 GHz test signal for output at node 14. This test signal is then injected into the proper node of an integrated circuit under test by contacting the metalization pattern 16 in FIG. 2 to the appropriate contact pad of the integrated circuit.

The active probe is constructed on a substrate 18 of insulating material. In the preferred embodiment, this substrate is alumina with an isotropic dielectric constant of 9.9 and is 125 microns thick. However, in alternative embodiments, any insulator with an isotropic dielectric constant of approximately 10 and having the same thickness of 125 microns will suffice as long as the other dimensions of the structure are such that the desired electrical characteristics detailed herein may be obtained. Those skilled in the art will appreciate that 50 ohm characteristic impedance uniplanar transmission lines may be constructed using other dimensions or other configurations. In such alternative embodiments, substrate materials having different thicknesses and dielectric constants could conceivably be chosen.

The structure of the coplanar waveguide of the active probe includes two ground planes 20 and 22 separated by a gap 24 through which runs an RF signal conductor 26. These two ground planes and the RF signal conductor are photolithographically etched from a metalization layer which is deposited upon the surface of the substrate 18. This metalization layer is approximately 1 micron thick in the preferred embodiment. There is no backside metalization. In the preferred embodiment, the metalization layer is principally gold with a thin layer of titanium-tungsten alloy formed over the gold for adhesion purposes.

The RF signal path of the active probe 10 is divided into several segments. The first segment is a 50 ohm coplanar waveguide comprised of the RF signal conductor 26, the insulating gaps 24 and the ground planes 20 and 22 as well as the substrate 18. This coplanar waveguide has a first width in a first segment and a second narrower width in a second segment starting at 28. The second segment narrows proportionally at 28 such that all dimensions are reduced so as to retain their same relative sizes.

Figure 7:
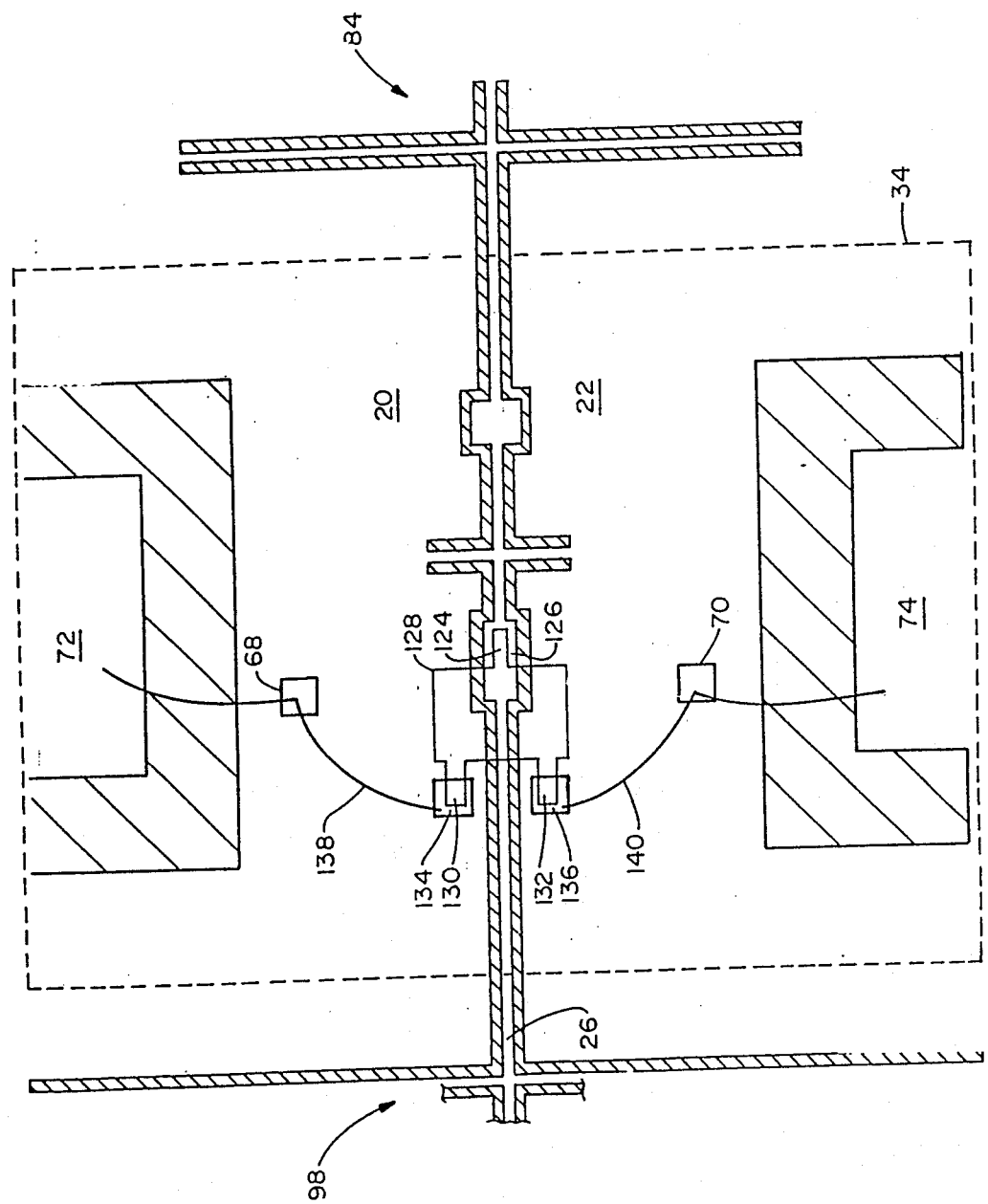
FIG. 7 is scale drawing of the diode nonlinear element section.

A low pass filter segment has an input at 30 in FIG. 1. This low pass filter output is at 32. An input impedance matching section has an input at 32. A pair of anti-parallel, beam lead diodes are bonded to the substrate at 34 which is the output of the input impedance matching section. These beam lead diodes have D.C. bias connections to two D.C. input lines 36 and 38. These D.C. bias lines are coupled to the center pins of coaxial connectors 40 and 42 by gold bond wires 44 and 46. Likewise, the center conductor of the coaxial connector 12 is connected to the RF signal line 26 by a gold bond wire or ribbon 48. The ground or shield terminals of the coaxial connectors 40, 12 and 42 are electrically connected to a metal mounting bracket 50 having mounting holes 52, 54 and 56 for purposes of physically securing the mounting bracket to a semiconductor wafer probing station. The metal of this mounting bracket 50 is electrically connected to the ground planes 20 and 22 by conductive epoxy 58 and 60. The D.C. bias conductors 36 and 38 run along the surface of the substrate in insulating gaps 60 and 62 formed in the ground plane metalization. Each of the D.C. bias conductors has gold bond wires which connect the conductors to one terminal of the diodes and to one or more chip capacitors which are bonded to the ground plane to form a low impedance path to ground for high frequency RF signals. Wires 64 and 66, respectively, are examples of such gold bond wires which, in the embodiment shown, couple the D.C. bias conductor to chip capacitors, 68 and 70, respectively. These chip capacitors are essentially parallel plate capacitors formed by metalization of opposing surfaces of a dielectric substrate. One metallized surface of the capacitor is then bonded to the ground plane by conductive epoxy and the opposite surface is bonded to the gold bond wire. Each of these chip capacitors is coupled to a D.C. bias contact pad, 72 and 74, respectively, by a gold bond wire in the illustrated embodiment. Other embodiments are possible, and one such alternative embodiment is illustrated in FIG. 7. Gold wires 76 and 78 couple the capacitors to the pads. Each of the D.C. bias contact pads 72 and 74 is coupled to a terminal of one of the anti-parallel beam lead diode pair by one of the gold bond wires, 80 or 82.

An output impedance matching section is shown generally at 84 having its input coupled to the shared node of the diode pair and having an output. The purpose of this output impedance section is generally to couple as much energy as possible at the fifth harmonic out of the diodes and to short the third harmonic. A further purpose is to reflect the input signal back toward the diodes.

Finally, a band pass filter section 86 coupled to the output of the output impedance matching section and to the output node 14. The purpose of the bandpass section is to filter out all but the desired fifth harmonic.

In FIG. 3, there is shown a block diagram of the filter and matching sections of the frequency multiplier circuit according to one embodiment of the apparatus of the invention which has been successfully tested in the laboratory. There are, however, other alternative preferred designs for the various filter and impedance matching sections which are contemplated by the inventors to have better electrical characteristics according to the criteria set out below but which have not yet been laboratory tested.

The frequency multipier section of the active probe receives the input signal at node 30. The purpose of the low pass filter 88 is to pass the input signal frequency (approximately 20 GHz) but to reject any other higher frequencies propagating in either direction. The low pass filter 88 exhibits an input impedance of 50 ohm at the input frequency at terminal 30. This permits maximum power transfer from the transmission line 26 into the low pass filter. The low pass filter is designed to have a cutoff frequency just slightly above the maximum frequency of the input signal. In the preferred embodiment, the cutoff frequency for the low pass filter would be approximately 25 GHz. The low pass filter 88 should also reject all higher harmonics of the input signal frequency. Ideally, the low pass filter would exhibit an impedance at terminal 32 looking toward the input terminal 30 which is substantially near zero at the frequency of the third harmonic and substantially infinite at the frequency of the fifth harmonic. However, this is not critical if the output impedance of the input impedance matching section to be described below exhibits these characteristics at the frequencies of the third and fifth harmonics. Also, the output impedance of the low pass filter should be substantially near zero for all harmonics higher than the fifth harmonic to suppress these frequencies. Thus, any third harmonic signal which reaches node 32 traveling toward the input 30 will be suppressed by what is essentially a short circuit. Likewise, any fifth harmonic energy reaching node 32 traveling toward the input 30 will be reflected toward the output 14 by the essentially infinite impedance seen at that frequency at node 32. It is desirable for the transfer function of the low pass filter 88 to be essentially flat over the band of input frequencies of interest.

In the embodiment shown in FIG. 3, the structure of the low pass filter is implemented using segments of coplanar waveguide/transmission line to conduct the signal from input 30 to output node 32. These segments are coupled to 4 stubs of coplanar waveguide which are terminated in open circuits and which, together with the line segments, provide the desired capacitive and inductive reactances to obtain the filter characteristics defined above. In the symbology used in FIG. 3, stub lines 90, 92, 94 and 96 should be interpreted as depicting four coplanar waveguide stubs terminated in open circuits. A pseudo-scale drawing (perhaps distorted by the photoreproduction process) of the low pass filter section 88 and all the other impedance matching and filter sections is shown in FIG. 6. The dimensions of the various segments of transmission line and the gap widths are given on FIG. 6 in microns. The dimensions of the various structures define the electrical characteristics. More specifically, the width and thickness of the RF signal conductors, the gap widths, the separation of the various stub lines, the dimensions of the stub line center conductors and their gap widths to the ground plane, and the length of the stub and line segments in addition to the thickness of the metalization, and the thickness of the substrate and its dielectric constant are the design parameters by which the desired electrical characteristics of any particular filter or impedance matching section may be set. Those microwave engineers who are familiar with the design principles of uniplanar and coplanar waveguides and who are familiar with the synthesis of filters using discrete components and who are familiar with the process of converting from lumped filter design to distributed filter design by way of the Richards transformation and the Kuroda identities (both of which are in the literature) will be fully enabled to recreate any of the embodiments given herein or to design other filter and impedance matching sections which have even better electrical characteristics for this application. There are many possible topologies for the design of the various filter and impedance matching sections which can satisfy the electrical requirements given here. Any topology which satisfies the electrical requirements given here will suffice for purposes of practicing the invention. The embodiment of FIG. 3 has been laboratory tested and is known to work. Guidance as to the desired electrical characteristics for each section will be given herein for purposes of enabling those skilled in the art to make their own designs for each section.

The purpose of the input impedance matching network is to transform the 50 ohm characteristic impedance at the output 32 of the low pass filter at the frequency of the input signal to the input impedance of the antiparallel diode pair 34 at the frequency of the input signal. It is desired to obtain maximum power transfer into the diode pair 34 at the frequency of the input signal to maximize the power of the fifth harmonic generated in the diodes. The input impedance matching network 98 has the additional function of suppressing the third harmonic and reflecting the fifth harmonic toward the output 14. Specifically, the input impedance matching network 98 should have an input impedance at node 32 at the frequency of the input signal which is the complex conjugate of the low pass filter output impedance at node 32, i.e., approximately 50 ohms. At the input 100 to the diodes, the impedance looking into the input impedance matching network 98 should be substantially near zero at the frequency of the third harmonic and at the frequencies of the harmonics above the fifth harmonic so that these harmonics are suppressed by what is essentially a short circuit. However, the impedance at node 100 for energy at the fifth harmonic frequency which is traveling toward the input 30 should be substantially infinite or high enough to substantially reflect all this energy toward the output 14. In the preferred embodiment, substantially all of the fifth harmonic energy will be reflected toward the output 14 by the impedance at node 100. Thus, it will not be necessary to design the low pass filter 88 to reflect fifth harmonic energy reaching node 32 with the output 14. The input impedance matching network in the embodiment shown in FIG. 3 is comprised of a single coplanar waveguide segment 102 coupled to two coplanar waveguide stubs 104 and 106 which are terminated in short circuits.

The diode pair 34 serves to provide the nonlinearity which implements the frequency multiplier function. The purpose of the diode pair is to receive the input signal at approximately 20 GHz and generate a plurality of harmonics of this frequency by conducting the input signal to ground through the non-linear equivalent circuit of the diodes. Because this diode pair has a non-linear voltage-to-current characteristic, the harmonics are generated. The diodes are connected in antiparallel fashion so that the I-V characteristic relating voltage across the junctions to current through the junctions is as shown in FIG. 4. It can be shown through a Taylor series expansion of the exponential function shown in FIG. 4 that only odd-numbered harmonics are generated from the symmetrical structure of the diode pair shown in FIG. 3. This is because of the symmetry of the structure. FIG. 5 is a symbolic diagram of the spectrum of frequencies generated by the non-linearity of the diode pair. The intensities of the various harmonics are only symbolically shown in FIG. 5. The actual intensities or power levels of each harmonic will be defined by the various coefficients of the terms of the Taylor series expansion and the embedding circuit.

Each diode in the diode pair 34 is coupled to RF signal ground through at least one capacitor. Capacitors 68 and 70 are examples of such capacitors. Likewise, each diode is coupled to a D.C. bias line 64 or 66. The purpose of the capacitors is to block flow of D.C. current to ground but to provide a low impedance path to ground for high frequency signals. D.C. bias may be applied to the diodes through these wires and the RF signal conductor 26 so as to individually bias each diode to electrically match the diodes. The reason for this matching is to substantially completely cancel generation of all even harmonics. In practice, when using the active probe, the D.C. bias to each diode can be changed while observing the intensity of the various harmonic frequencies generated by the diodes. The D.C. bias is changed until the minimum amount of even harmonic signal energy is observed. In embodiments where integrated diodes having matching characteristics or other matched diodes are used, the D.C. bias connection is not necessary.

In the preferred embodiment, the capacitors 68 and 70 are each comprised of one or more chip capacitors which are spaced along the gold bond wire path from the connectors 36 and 38 to the diodes 34. The number of capacitors used for each capacitor symbolized by blocks 68 and 70 depends upon the operating frequencies. It is important to provide a very low impedance path to ground for both the input frequency and the fifth harmonic thereof. The reason two capacitors are used in the preferred embodiment is that the capacitance of the chip capacitors is limited, and since it is necessary to insure that a sufficiently low impedance path to ground will be provided for frequencies on the order of 20 GHz, two chip capacitors in parallel are used. By keeping the impedance of the path to ground for this frequency low, the maximum amount of current at this frequency is passed through the diode pair nonlinearity thereby increasing the intensity of the harmonic energy which is generated.

It is desirable that the junction capacitance of the diodes in the diode pair 34 be quite small so as to not present a virtual short across the diode junction for very high frequency signals. It is preferred that this junction capacitance be less than 0.02 picofarads. It is also desirable that the series resistance of the diodes in the diode pair be less than 10 ohms. The reason for this is to maximize the amount of fifth harmonic signal which is generated while minimizing dissipative losses. Greater intensity for the 100 GHz test signal output is always desirable to minimize signal-to-noise ratio problems in the characterization of the chip under test. It is also important that the inductance of the leads which conduct current to the diode junctions be as small as possible. This lead inductance represents a reactance which increases with increasing frequency thereby decreasing the amount of high frequency current flowing through the diode junction and decreasing the intensity of fifth harmonic energy generated by the diode pair. For the foregoing reasons, commercially available beam lead diodes which are integrated on gallium arsenite substrate are preferred. Such diodes are available at least from Hewlett Packard Company of Santa Rosa, Calif.

The purpose of the output impedance matching network 84 is to match the output impedance of the diode pair 34 at the frequency of the fifth harmonic for maximum power transfer of fifth harmonic signal out of the diodes. In addition, the output impedance matching network 84 serves to suppress the transmission to the output 14 of the input signal and undesired harmonics such as the third harmonic and harmonics higher than the fifth. Typically, the output impedance matching network 84 has an input impedance at node 102 which is the complex conjugate of the output impedance of the diodes 34 at the frequency of the fifth harmonic. However, the impedance at the node 102 at the frequency of the third harmonic should be substantially near zero or as low as possible to suppress this harmonic before it reaches the output 14. The input impedance at node 102 at the frequency of the fundamental or input signal should be substantially infinite or as high as possible to reflect all energy at the frequency of the input signal back toward the diode pair 34.

As shown in FIG. 3, the output impedance matching network is comprised of four open circuit stub transmission lines 106, 108, 110 and 112. In addition, two stub transmission lines 114 and 116 having short circuit terminations are employed. Ideally, the impedance at node 118 for the output impedance matching network at the frequency of the fifth harmonic is approximately 50 ohms.

The final filter section in the active probe is a band pass filter 86. The purpose of this filter is to transmit the fifth harmonic signal to the output node 14 and dissipate or reflect all other signals having frequencies outside the pass band of the bandpass filter. Ideally, the bandpass filter 86 should have a band width which encompasses the range of frequencies surrounding approximately 100 GHz which are to be used and should have a transfer function or filter attenuation characteristic which is substantially flat over the frequency band of interest. Also, the bandpass filter should have an input impedance at node 118 which is the complex conjugate of the output impedance of the output impedance matching network 84 at the frequency of the fifth harmonic. The bandpass filter should also have an output impedance at output node 14 which is substantially near 50 ohms.

Referring to FIG. 6 there is shown a pseudo-scale model of the frequency multiplier section of the active probe (caution to the reader-the original scale may have been distorted in the photographic reproduction process to print this patent). The length and width dimensions in microns of each conductor are marked on the drawing near the corresponding segment. All gap widths are 25 microns. The substrate thickness is 125 microns with an isotropic dielectric constant of 9.9. The metalization gold with a Titanium-tungsten overcoat and a total thickness of 1 micron. The embodiment shown in FIG. 6 has been laboratory tested and the results of this testing are given in Appendix A. Those skilled in the art, however, can easily envision other topographies for the filter and impedance matching sections which will have improved electrical characteristics over the topography shown in FIG. 6 so as to better meet the criteria given for each section as given in the above description of FIG. 3. In FIG. 6 the stub transmission lines which have short black segments connecting the black pair of lines representing gaps defining each segment represent an open circuit termination for that particular stub line. Likewise, the stublines which have two black lines terminating at the end of the stub with no connection between the two black lines represent a short circuit termination to the ground plane. The ground plane is the white area surrounding the entire structure shown in FIG. 6. The white area inside the black lines represents the RF signal conductor of the frequency multiplier section of the active probe. As noted above, the stub transmission lines together with the interconnecting line segments are used to provide appropriate inductive and capacitive components for each filter and impedance matching section to define its impedance and attenuation characteristic. Note that the structure of FIG. 6 shows a plurality of shorting wires such as the wire 120 which connect the two halves of the ground plane on either side of RF signal transmission line 26. These shorting wires are used to suppress even coplanar waveguide modes which could be transmitted along the two halves of the ground plane. That is, the two halves of the ground plane 20 and 22 can transmit energy from one end of the probe to the other if variations in potential between the two halves of the ground plane are allowed. The multiple shorting wires such as the wire 120 tie the two halves of the ground plane together at a plurality of locations thereby preventing any voltage potential difference from existing between the two halves of the ground plane. This prevents transmission of any energy in a spurious mode involving the ground planes.

The desired mode of transmission through the active probe is the quasi-TEM mode. Any discontinuities can result in scattering of energy into other undesired modes. For this reason it is desirable to minimize any discontinuities to prevent such scattering.

Referring to FIG. 7 there is shown a scale drawing of the diode section assembly at a substantially larger scale than has heretofore been shown. The embodiment shown in FIG. 7 is slightly different than the embodiment shown in FIG. 1 in the placement of the chip capacitor 68 and 70. As noted earlier these two chip capacitors are in fact four capacitors wired in parallel. The RF input signal is coupled to the shared node 124 of the anti-parallel pair diodes at a contact pad 126. This input signal at approximately 20 GHz then propagates to ground through the junctions of the beam lead diodes. These diodes are shown at 128 schematically as a simple three terminal block. The individual terminals of the two diodes at 130 and 132 are coupled, respectively, to a terminal of each of the two chip capacitors 134 and 136. Each of these chip capacitors has its other terminal coupled to the ground plane 20 or 22 by conductive epoxy. The second set of chip capacitors, 68 and 70, are located between the beam lead diodes 128 and a pair of D.C. bias contact pads 72 and 74. These chip capacitors each have one terminal which is bonded to the ground plane 20 or 22 by conductive epoxy and each has a second terminal. Two gold wires, 138 and 140, are wire bonded between the second terminals of chip capacitors 68 and 70 and chip capacitors 134 and 136. These four chip capacitors are therefore parallel paths to ground for the high frequency RF signals but block signals at D.C. In alternative embodiments, the D.C. bias lines may be omitted if matched diodes are used or if filter sections are available which can adequately suppress the undesired harmonics including even harmonics which will result if the diodes are not evenly matched.

The structure of the active probe described herein has the important advantage of using readily available high power microwave sources to provide the input signal to drive the non-linear device. Interfacing between the microwave source and the probe input is implemented over a broad bandwidth with a low loss coaxial to coplanar waveguide transition. The microwave signals are multiplied to the appropriate millimeter-wave frequency, and the probe is contacted directly to the input pad of the device under test thereby supplying the test signal. Electrooptic sampling can then be used to measure input/output and internal node parameters of the device under test. Electrooptic sampling is well known in the literature and is described in an article by Weingarten, Rodwell and Bloom entitled "Pico Second Optical Sampling of Gallium Arsenide Integrated Circuits", IEEE journal of Quantum Electronics, Volume 24, No. 2, February 1988, pp: 198–220.

In alternative embodiments, other forms of planer transmission media such as microstrip transmission lines may be used. One of the major advantages of coplanar and uniplanar waveguides over microstrip transmission lines at millimeter-wave frequencies is the existence of ground conductors on the same plane as the signal conductors. This class of transmission lines is sometimes also referred to as uniplanar transmission lines. The advantage of uniplanar waveguide is that short connection paths between circuit elements maybe realized with resulting low dissipative and reactive parasitic impedances and without the need for via holes. Characteristic impedance of coplanar waveguide is also less sensitive to substrate thickness variations compared with microstrip transmission lines.

In designing uniplanar waveguides circuits, care must be taken to avoid excitation of undesired modes. To suppress the even modes in coplanar waveguide circuits for the active probe, gold bond wires are used instead of air bridges to reduce circuit fabrication complexity. However, in alternative embodiments, air bridges may be used. It is also important to avoid major discontinuities in the design of the coplanar waveguide to avoid exciting undesired modes. Such discontinuities involved an abrupt change in the dimensions of the center conductor or gap spacings. These changes give rise to changes in the electric and magnetic field distribution that can be represented by an equivalent capacitance and equivalent inductance. The discontinuities are then characterized by evaluating these capacitances and inductances. The types of discontinuities present in the design of the active probe described herein are the step in the center conductor width, the step in gap spacing and the cross junctions at the location of the stubs. Although at low frequencies these discontinuities typically cause only very small perturbations of signal propagation, at millimeter-wave frequencies the effects are not negligible. The effects of these discontinuities were evaluated using microstrip discontinuity models since coplanar waveguide discontinuity models are not currently available in microwave circuit simulation programs.

The diodes in the preferred embodiment are stacked Schottky-barrier diodes fabricated on gallium arsenide. Each Schottky diode consist of two parallel fingers, each ten micrometers long. The input impedance of the diodes for the input frequency band of 15 to 20 GHz is calculated under a large signal drive by signal of the same frequency. The output port of the diodes is assumed to be open circuit at the fundamental frequency which is a good approximation considering the relatively large out-of-band rejection of the output filter. The output impedance at 75 to 110 GHz (fifth harmonic frequency) is calculated with an input signal at the fundamental frequency. Since the circuit is non-linear, this impedance is a function of the load presented to the diodes at the fifth harmonic output frequency.

The filters of the active probe were designed based upon doubly-terminated, lumped, low-pass prototype filters. The terminating impedance on both ports were chosen to be 50 ohms. The coplanar waveguide filters were further optimized using TOUCHSTONE ™ software.

The input filter was designed to provide low insertion loss for the pass band and to provide rejection of the odd harmonics of the pass band, in particular the fifth harmonic. The circuit was fabricated on an alumina substrate using thin film deposition and lift-off of sputtered tantalum-gold followed by additional gold plating to reduce skin effect loses. One mil diameter gold wire was used to connect the ground plane at multiple locations on the two sides of the center conductor to suppress even modes.

Further details of the structure, design and testing of the invention are given in Appendix A which is a description of the invention given in a final report to Wright Patterson Air Force Base Avionics Laboratory Chapter 7, Section 7.3.1 from January 1988.

Although the invention has been described in terms of the preferred embodiment detailed herein, those skilled in the art will appreciate many modifications which may be made without departing from the true spirit scope of the invention. All such modifications are intended to be included within the scope of the claims appended hereto.

What is claimed is:

1. An apparatus having a tapered substrate and a coaxial input and a co-planar waveguide output for generating millimeter-wavelength frequencies comprising:

a low pass filter having an input for receiving an input signal at a first frequency and having an output and having a selected characteristic input and output impedance at said first frequency selected to match the output impedance of any source coupled to said coaxial input;

at least one non-linear element, such as one pair of diodes coupled together in an antiparallel network, acting as a harmonic generator and having first and second ports, said second port being coupled to a reference potential such as ground potential;

an input impedance matching network having an input coupled to said output of said low pass filter and having an output coupled to said first port of said diode network and having an input impedance at said first frequency which substantially matches the output impedance of said low pass filter and having an output impedance which substantially matches the input impedance of said diodes at said first frequency and which causes reflection of a desired harmonic toward said output and which suppresses the generation of at least some other harmonics having frequencies above and below the frequency of said desired harmonic;

an output impedance matching network having an input port coupled to said first port of said diode network and having an output port and having an impedance at said input port which substantially matches the output impedance of said diodes at the frequency of said desired harmonic and which is high enough at said first frequency to reflect energy at said first frequency toward said input and which is low enough at the frequency of one or more other harmonics to substantially suppress the generation thereof and having said characteristic impedance at said output port at the frequency of said desired harmonic; and a bandpass filter having an input port coupled to the output port of said output matching network, and having an output port coupled to said co-planar waveguide output, and having said characteristic impedance at said input port and said output port at the frequency of said desired harmonic.

2. The apparatus of claim 1 wherein said at least one pair of diodes are substantially matched and form a path to said reference potential through a non-linearity thereby causing odd-numbered harmonics of said first frequency to be generated.

3. The apparatus of claim 2 wherein said output impedance of said input impedance matching network at the frequency of said undesired harmonic present, such as the third harmonic for a quintupler harmonic generator, is low enough to substantially suppress generation of said third harmonic.

4. The apparatus of claim 3 wherein said output impedance matching network has said selected characteristic impedance at the frequency of said fifth harmonic.

5. An apparatus for generating a millimeter-wavelength signal comprising:

harmonic generation means having a coaxial input for receiving an input signal at a first frequency and subjecting said input signal to an electrical non-linearity such that odd-numbered harmonics of said first frequency are generated if an odd-order frequency multiplier is used and even-numbered harmonics of said first frequency are generated if an even-order frequency multiplier is used, said harmonic generation means comprising a low pass filter section and an input impedance matching section formed with sections of coplanar waveguide integrated on an insulating, tapered substrate and including a harmonic generator coupled to said input impedance matching section, said low pass filter section having said coaxial input and a first characteristic input impedane at a first frequency and a cutoff frequency just above said first frequency, said input impedance matching section having an input coupled to said output of said low pass filter section and having an input impedance at said input of said impedance matching section at said first frequency which is substantially equal to said first characteristic input impedance, and having an output coupled to aid harmonic generator, said output having an output impedance at said first frequency which is substantially equal to the complex conjugate of the input impedance of said harmonic generator at said first frequency and which is substantially zero at a first selected harmonic of said first frequency and which is large enough at a second selected harmonic of said first frequency so as to reflect substantially all energy at said second selected harmonic frequency; and filter means having a co-planar waveguide output and coupled to said harmonic generation means for selecting at least one of said harmonics for transmission to said output and for suppressing transmission of said input signal and substantially all harmonics other than said selected harmonic to said output and for suppressing transmission of substantially any of said harmonics back to said input, said filter means comprising an output impedance matching section having an input and an output and a bandpass filter section having an input coupled to said output of said output impedance matching section and having a co-planar waveguide output, said output impedance matching section and said bandpass filter section being integrated with co-planar waveguide segments on said substrate such that said input of said output impedance matching section is coupled to said harmonic generator and has an input impedance which is substantially equal to the complex conjugate of the output impedance of said harmonic generator at said second selected harmonic of said first frequency and has an input impedance at said first frequency which is large enough to reflect substantially all energy at said first frequency and having an input impedance at least some other harmonics of said first frequency which is low enough so as to suppress propagation of said other harmonics through said output impedance matching circuit, and wherein said bandpass filter section has an impedance at said input and said output of said bandpass filter section at said second selected harmonic of said first frequency which is substantially equal to said first characteristic input impedance, and wherein said bandpass filter section is comprised of integrated co-planar waveguide segments coupled together so as to have a filter characteristic to pass signals at said second selected harmonic to said co-planar waveguide output but so as to prevent propagation of selected other harmonics of said first frequency toward said output.

6. The apparatus of claim 5 wherein said harmonic generator comprises a pair of antiparallel, beam lead diodes.

7. An active probe for a device or an integrated circuit for receiving an input signal at a first frequency and for outputting a selected harmonic of said first frequency comprising:

an insulating substrate which is tapered;

a conducting layer formed on a surface of said substrate into at least one ground plane and a signal conductor for said input signal and separated from said ground plane by a gap to form a first uniplanar transmission line, dimensions of said ground plane, gap and signal conductor being such that a characteristic impedance of said signal conductor at said first frequency is established at a selected impedance;

a low pass filter coupled to said signal conductor at an input comprising several elements including at least first and second stub uniplanar transmission lines coupled to said signal conductor and separated by a predetermined distance, each said stub terminated in an open circuit, and further comprising a plurality of segments of uniplanar transmission line of predetermined dimensions coupled to said input and coupled to said stubs and to an output, the dimensions of all these elements being selected so that said low pass filter has predetermined electrical characteristics and impedances at said input and said output at selected frequencies;

an input impedance matching circuit having an input and an output comprising uniplanar transmission line segments having several elements including two stub uniplanar transmission lines terminated in short circuits to said ground plane and a segment of uniplanar transmission line electrically coupled to said stubs and coupled at said input to receive an input signal from said output of said low pass filter, the dimensions of all these elements selected to provide predetermined electrical impedances at said input and said output at selected frequencies;

at least two matched, beam lead diodes coupled in antiparallel relationship, each having first and second nodes, said first nodes coupled to said output of said input impedance matching circuit and providing a non-linear electrical path to said ground plane for signals propagating through said input impedance matching circuit;

at least two capacitors, each coupled between said second node of one of said diodes and said ground plane;

an output impedance matching circuit having an output and having an input coupled to said first nodes of said diodes, comprising a plurality of elements including at least four stub uniplanar transmission line segments terminated in open circuits and at least two stub uniplanar transmission line segments terminated in short circuits to said ground plane, all said stubs being interconnected by at least four segments of uniplanar transmission line, the dimensions of all said elements selected to provide predetermined electrical characteristics at selected frequencies at said input and said output; and a bandpass filter circuit having an input coupled to said output of said output impedance matching circuit and having an output, said bandpass filter circuit comprising a plurality of elements including at least six stub uniplanar transmission line segments terminated in short circuits to said ground plane and at least four segments of uniplanar transmission line segments coupling said input to said output and coupling said stubs to each other, the dimensions of all said elements selected to provide predetermined electrical characteristics at selected frequencies at said input and said output.

8. A method of generating a test signal of millimeter-wavelength at an output comprising the steps of:
receiving an input signal having a first frequency at a coaxial input;
guiding said input signal to a non-linear element on a substrate through a low pass filter section and an input impedance matching section formed on a surface of said substrate from uniplanar waveguide segments, said low pass filter section and said input impedance matching sections each having predetermined impedance characteristics selected to present a characteristic impedance at said coaxial input and to provide maximum power transfer of said input signal to said non-linear element and to reflect substantially all energy at a first selected harmonic frequency toward said output and to suppress generation of at least one other harmonic frequency;
generating a plurality of harmonics of said input signal such that only every other harmonic is generated;
filtering out all but a selected harmonic using at least one bandpass filter and at least one output impedance matching section, said output impedance matching section and said bandpass filter having predetermined impedance characteristics so as to maximize power transfer out of said non-linear element at the frequency of said first selected harmonic and present said characteristic impedance to the propagation of said first selected harmonic and to reflect substantially all energy at said first frequency back toward said coaxial input and to suppress the generation of selected other harmonics of said first frequency, said bandpass filter and said output impedance matching section being formed of interconnected uniplanar transmission line segments formed on a surface of said substrate, and outputting the selected harmonic at a uniplanar output node.

9. The method of claim 8 wherein said step of generating either a plurality of harmonics comprises the step of guiding said input signal to ground potential through the junctions of at least two matched antiparallel beam lead diodes.

10. The method of claim 8 wherein the step of generating a plurality of harmonics comprises the step of generating odd numbered harmonics and guiding said input signal through the junctions of at least two antiparallel diodes and adjusting the individual D.C. bias applied to each said diodes so as to minimize the power in even-numbered harmonics.

11. The method of claim 8 wherein said filtering set includes guiding said filtered energy at the output of said output impedance matching network through a bandpass filter which has a passband such that all frequencies except said desired first selected output harmonic are substantially eliminated.

12. A method of generating a millimeter-wavelength signal comprising the steps of:
guiding an input signal at a first frequency to a test probe via a coaxial coupling;
coupling energy from said coaxial coupling into an integrated uniplanar transmission line;
guiding said input signal along said uniplanar transmission line to the input of a low pass filter;
filtering said input signal in a low pass filter having a cutoff frequency above said first frequency and below the lowest order undesired harmonic of said first frequency, and subjecting said input signal to a selected characteristic impedance in said low pass filter which substantially matches the impedance seen looking out said coaxial coupling at said first frequency;
coupling the filtered input signal through an impedance matching circuit to a pair of antiparallel coupled, matched diodes, and subjecting said input signal at said first frequency to said selected characteristic impedance at the input of said impedance matching circuit and to an impendance at a node of said impedance matching circuit coupled to said diodes which substantially matches the impedance of said diodes at said first frequency but which is high enough to reflect substantially all energy at a selected desired harmonic of said first frequency;

subjecting selected other harmonic frequencies generated by diodes to an impedance which is low enough to substantially dissipate or prevent the generation of said selected other harmonic frequencies;

coupling the harmonics generated in said diodes through an output impedance matching network having electrical characteristics so as to reflect energy at said first frequency and transmit energy at the desired selected output harmonic of said first frequency while subjecting said energy at said selected desired harmonic to said selected characteristic impedance; and filtering the selected desired harmonic signal using a bandpass filter having said selected characteristic impedance at the frequency of said desired selected output harmonic and having a passband which encompasses said selected desired output harmonic; and outputting said selected desired harmonic at an output node suitable for probing an integrated circuit.

* * * * *